United States Patent
Chen et al.

(10) Patent No.: US 9,553,195 B2
(45) Date of Patent: Jan. 24, 2017

(54) METHOD OF IGZO AND ZNO TFT FABRICATION WITH PECVD SIO$_2$ PASSIVATION

(75) Inventors: Jrjyan Jerry Chen, Campbell, CA (US); Soo Young Choi, Fremont, CA (US); Dong-Kil Yim, Pleasanton, CA (US); Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 791 days.

(21) Appl. No.: 13/490,813

(22) Filed: Jun. 7, 2012

(65) Prior Publication Data

US 2013/0005081 A1    Jan. 3, 2013

Related U.S. Application Data

(60) Provisional application No. 61/503,413, filed on Jun. 30, 2011.

(51) Int. Cl.
   *H01L 21/336*    (2006.01)
   *H01L 29/786*    (2006.01)
   *H01L 29/66*     (2006.01)

(52) U.S. Cl.
   CPC ... *H01L 29/78606* (2013.01); *H01L 29/66969* (2013.01); *H01L 29/7869* (2013.01)

(58) Field of Classification Search
   CPC ........... H01L 29/7869; H01L 29/66969; H01L 29/78606
   See application file for complete search history.

(56) References Cited

U.S. PATENT DOCUMENTS

| | | | |
|---|---|---|---|
| 2009/0029498 A1* | 1/2009 | Yamazaki | H01J 37/32192 438/30 |
| 2010/0001272 A1 | 1/2010 | Ye | |
| 2010/0001346 A1 | 1/2010 | Ye | |
| 2010/0072468 A1 | 3/2010 | Yamazaki et al. | |
| 2010/0084649 A1* | 4/2010 | Seo | H01L 29/7869 257/43 |
| 2011/0053384 A1 | 3/2011 | Koyama et al. | |
| 2011/0117697 A1 | 5/2011 | Akimoto et al. | |
| 2011/0133181 A1 | 6/2011 | Yamazaki | |

FOREIGN PATENT DOCUMENTS

CN    1622296 A    6/2005

OTHER PUBLICATIONS

Chinese Office Action (with attached English translation of the Search Report) for Application No. 201280028759.X dated Jan. 18, 2016; 11 total pages.
Official Letter dated Jan. 12, 2016, from Taiwan Patent Office for corresponding Taiwan Patent Application No. 101121383.

* cited by examiner

*Primary Examiner* — Seahvosh Nikmanesh
(74) *Attorney, Agent, or Firm* — Patterson & Sheridan, LLP (57) ABSTRACT

The present invention generally relates to a method of manufacturing a TFT. The TFT has an active channel that comprises IGZO or zinc oxide. After the source and drain electrodes are formed, but before the passivation layers or etch stop layers are deposited thereover, the active channel is exposed to an N$_2$O or O$_2$ plasma. The interface between the active channel and the passivation layers or etch stop layers are either altered or damaged during formation of the source and drain electrodes. The N$_2$O or O$_2$ plasma alters and repairs the interface between the active channel and the passivation or etch stop layers.

16 Claims, 6 Drawing Sheets

METHOD OF IGZO AND ZNO TFT FABRICATION WITH PECVD SIO₂ PASSIVATION

CROSS-REFERENCE TO RELATED APPLICATIONS

This application claims benefit of U.S. Provisional Patent Application Ser. No. 61/503,413, filed Jun. 30, 2011, which is herein incorporated by reference.

BACKGROUND OF THE INVENTION

Field of the Invention

Embodiments of the present invention generally relate to a method of manufacturing a thin film transistor (TFT).

Description of the Related Art

TFTs are used as switching and driving devices in almost all integrated circuits (IC). Additionally, TFTs are utilized in the flat panel display (FPD) industry to control pixels. For many years, the primary material for TFT fabrication has been silicon. Silicon may be used for the active layer within the TFT and may be doped as desired to make the TFT function accordingly. Silicon does have its limitations. For one, silicon is not transparent. More and more companies are striving to develop transparent TFTs.

One of the materials thought to be beneficial for transparent TFTs is indium-gallium-zinc oxide (IGZO). Another material thought to be beneficial for transparent TFTs is zinc oxide. There is a need in the art for a method to fabricate TFTs utilizing IGZO and/or zinc oxide.

SUMMARY OF THE INVENTION

The present invention generally relates to a method of manufacturing a TFT. The TFT has an active channel that comprises IGZO or zinc oxide. After the source and drain electrodes are formed, but before the passivation layers or etch stop layers are deposited thereover, the active channel is exposed to an $N_2O$ or $O_2$ plasma. The interface between the active channel and the passivation layers or etch stop layers are either altered or damaged during formation of the source and drain electrodes. The $N_2O$ or $O_2$ plasma alters and repairs the interface between the active channel and the passivation or etch stop layers.

In one embodiment, a method comprises forming an active channel in a thin film transistor by defining source and drain electrodes, exposing the active channel to a $N_2O$ or $O_2$ plasma and depositing one or more passivation or etch stop layers over the $N_2O$ or $O_2$ plasma treated active channel.

In another embodiment, a method comprises forming a gate electrode over a substrate, depositing a gate dielectric layer over the gate electrode and the substrate, depositing an IGZO active layer over the gate dielectric layer, depositing a conductive layer over the active layer, removing at least a portion of the conductive layer to form source and drain electrodes and to form an active channel by exposing a portion of the active layer, exposing the active channel to a $N_2O$ or $O_2$ plasma and depositing one or more passivation or etch stop layers over the $N_2O$ or $O_2$ plasma exposed active channel.

In another embodiment, a method comprises forming a gate electrode over a substrate, depositing a gate dielectric layer over the gate electrode and the substrate, depositing a zinc oxide active layer over the gate dielectric layer, depositing a conductive layer over the active layer, removing at least a portion of the conductive layer to form source and drain electrodes and to form an active channel by exposing a portion of the active layer, exposing the active channel to a $N_2O$ or $O_2$ plasma and depositing one or more passivation or etch stop layers over the $N_2O$ or $O_2$ plasma exposed active channel.

In another embodiment, a thin film transistor includes a gate electrode disposed over a substrate, a gate dielectric layer disposed over the gate electrode and the substrate, a plasma treated active layer comprising zinc oxide or indium-gallium-zinc-oxide disposed over the gate dielectric layer, a source electrode and a drain electrode spaced apart and formed over the plasma treated active layer such that a portion of the plasma treated active layer remains exposed and one or more or etch stop passivation layers disposed over the exposed active plasma treated active layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a method of manufacturing a TFT. The TFT has an active channel that comprises IGZO or zinc oxide. After the source and drain electrodes are formed, but before the passivation layers or etch stop layers are deposited thereover, the active channel is exposed to an $N_2O$ or $O_2$ plasma. The interface between the active channel and the passivation layers or etch stop layers are either altered or damaged during formation of the source and drain electrodes. The $N_2O$ or $O_2$ plasma alters and repairs the interface between the active channel and the passivation or etch stop layers.

Figure 1:
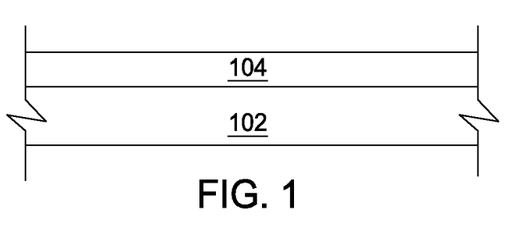
FIGS. 1-9 are schematic illustrations of a TFT at various stages of fabrication according to one embodiment.

FIGS. 1-9 are schematic illustrations of a TFT at various stages of fabrication according to one embodiment. As shown in FIG. 1, the TFT is fabricated by depositing a conductive layer 104 over a substrate 102. Suitable materials that may be utilized for the substrate 102 include glass, soda lime glass, plastic, and semiconductor wafers. If soda lime glass is utilized as the substrate 102, one or more barrier layers will be deposited over the substrate 102 prior to depositing the conductive layer 104. Suitable materials that may be utilized for the conductive layer 104 include chromium, molybdenum, copper, aluminum, tungsten, titanium, and combinations thereof. The conductive layer 104 may be formed by physical vapor deposition (PVD) or other suitable deposition methods, such as electroplating, electroless plating or chemical vapor deposition (CVD).

Figure 2:
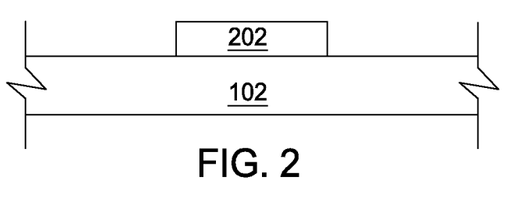

As shown in FIG. 2, the conductive layer 104 is patterned to form a gate electrode 202. The patterning may occur by forming either a photolithographic mask or a hard mask over the conductive layer 104 and exposing the conductive layer 104 to an etchant. Depending upon the material utilized for the conductive layer 104, the conductive layer 104 may be patterned using a wet etchant or by exposing the conductive layer 104 not covered by the mask to an etching plasma. In one embodiment, the conductive layer 104 may be patterned by etching areas of the conductive layer 104 that are not covered by a mask with an etching plasma comprising etchants such as $SF_6$, $O_2$, $Cl_2$, and combinations thereof.

Figure 3:
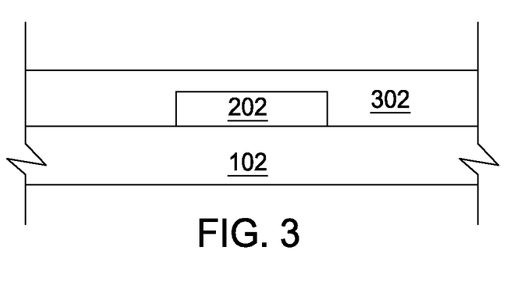

As shown in FIG. 3, after the gate electrode 202 has been formed, a gate dielectric layer 302 is deposited thereover. Suitable materials that may be utilized for the gate dielectric layer 302 include silicon nitride, silicon oxide, and silicon oxynitride. Additionally, while shown as a single layer, it is contemplated that the gate dielectric layer 302 may comprise multiple layers, each of which may comprise a different chemical composition. Suitable methods for depositing the gate dielectric layer 302 include conformal deposition methods such as plasma enhanced chemical vapor deposition (PECVD), CVD and atomic layer deposition (ALD).

Figure 4:
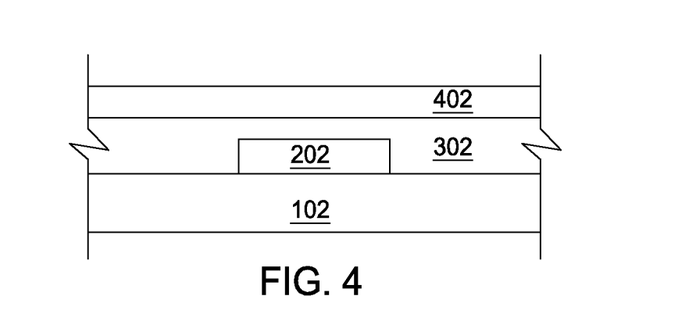

As shown in FIG. 4, a high mobility active layer 402 is deposited. Suitable materials that may be used for the high mobility active layer 402 include IGZO and zinc oxide. The active layer 402 may be deposited by suitable deposition methods such as PVD. In one embodiment, the PVD may comprise applying a DC bias to a rotary cathode.

Figure 5:
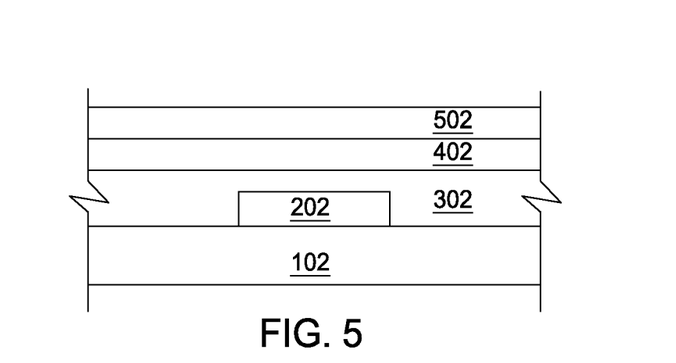

As shown in FIG. 5, a conductive layer 502 may be deposited over the active layer 402. Suitable materials that may be utilized for the conductive layer 502 include chromium, molybdenum, copper, aluminum, tungsten, titanium, and combinations thereof. The conductive layer 502 may be formed by PVD or other suitable deposition methods such as electroplating, electroless plating or CVD.

Figure 6:
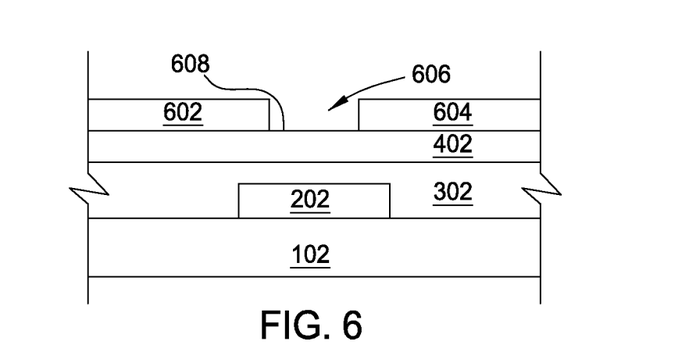

As shown in FIG. 6, the conductive layer 502 is patterned to form a source electrode 602 and a drain electrode 604 by a back channel etch process. The patterning may occur by forming either a photolithographic mask or a hard mask over the conductive layer 502 and exposing the conductive layer 502 to an etchant. Depending upon the material utilized for the conductive layer 520, the conductive layer 502 may be patterned using a wet etchant or by exposing the conductive layer 502 not covered by the mask to an etching plasma. In one embodiment, the conductive layer 502 may be patterned by etching areas of the conductive layer 502 that are not covered by a mask with an etching plasma comprising etchants such as $SF_6$, $O_2$, and combinations thereof. In forming the source electrode 602 and the drain electrode 604, a portion 608 of the active layer 402 is exposed. The exposed portion 608 is between the source and drain electrodes 602, 604. The area between the source and drain electrode 602, 604 is referred to as the active channel 606. As will be discussed below, one or more passivation layers will be formed over the active channel 606.

Due to the high sensitivity of IGZO TFTs at the interface of IGZO, more specifically at the active channel 606, and passivation layers (PV), an etch stop layer has been adapted for TFT fabrication to prevent channel damage during etching of the conductive layer 502. However, the etch stop layer fabrication requires more mask steps and significantly increase the manufacturing cost. In the etch stop device manufacturing process, the etch stop layer is deposited prior to deposition of the conductive layer that is patterned/etched to define the source and drain electrodes.

Figure 7:
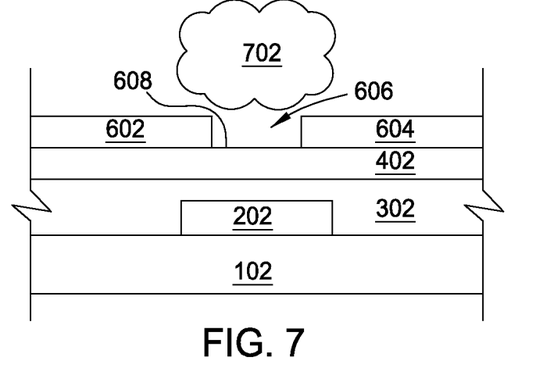

Alternatively, the back channel etch process described above utilizes fewer masks than the etch stop layer fabrication process and has a simple process flow for low cost fabrication of IGZO TFTs. However, preventing interface damage and charge accumulation at the IGZO-PV interface during source-drain formation by etch process is a challenge. Therefore, an $N_2O$ or $O_2$ plasma treatment is performed directly after the source-drain etch and before the passivation layer deposition. Without this plasma pre-treatment, IGZO TFTs will either fail to show any TFT characteristics or perform poorly under thermal bias stress. As shown in FIG. 7, the partially fabricated TFT is exposed to a $N_2O$ or $O_2$ plasma 702. The $N_2O$ or $O_2$ plasma 702 is formed in-situ the chamber in which the conductive layer 502 was patterned. The plasma treatment can occur prior to forming the etch stop layers (for an etch stop layer device) or before depositing the passivation layers (for a back channel etch device).

It has surprisingly been found that $N_2O$ or $O_2$ plasma is the most effective plasma to utilize to ensure a consistent TFT is fabricated. Plasma formed from argon or $N_2$ is too mild to have a significant effect on the active channel. It should also be noted that the $N_2O$ or $O_2$ plasma treatment will not be effective for silicon based TFTs. The oxygen from the $N_2O$ or $O_2$ plasma will react with the silicon in the active channel to form silicon oxide and cause the TFT to fail.

The passivation layer is the topmost layer of TFT devices which protects the devices from environment damage, including chemical or mechanical effects. The passivation layer also provides stable and reliable TFT performance against prolonged thermal and electrical bias stress. Due to the sensitivity of active materials, such as IGZO and zinc oxide, toward hydrogen and other environmental chemicals, high quality low hydrogen contain oxides, such as $TiO_2$ and silicon oxides, are preferred for the passivation layer instead of conventional silicon nitride ($SiN_x$).

Figure 8:
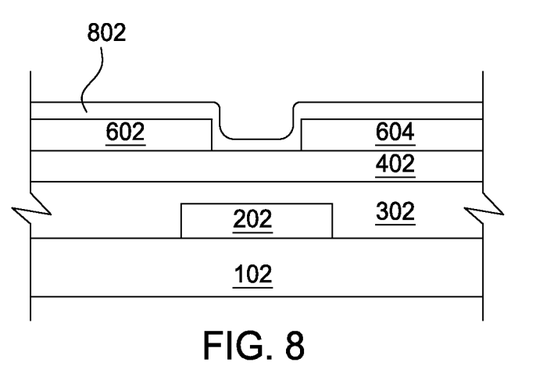
Figure 9:
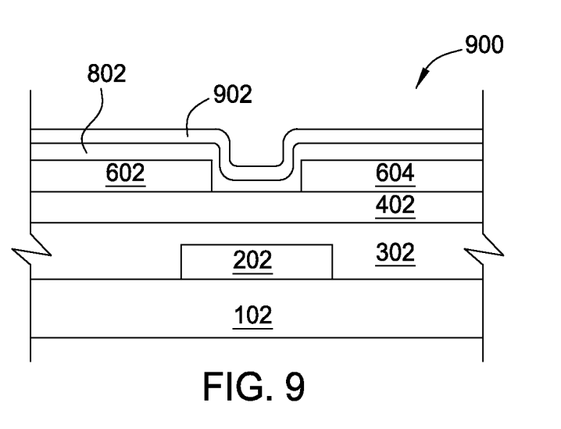

As shown in FIGS. 8 and 9, multiple passivation layers 802, 902 are deposited over the active channel 606 and the source and drain electrodes 602, 604. The first passivation layer 802 that is in contact with the exposed portion 608 of the active layer 402 comprises a low hydrogen containing oxide. The second passivation layer 902 is formed over the first passivation layer 802 and can comprise one or more additional layers of low hydrogen containing oxide, silicon nitride, silicon oxynitride, or combinations thereof.

When silicon oxide is used as the first passivation layer 802, the silicon oxide can be deposited either by PVD or PECVD. Considering the plasma damage associated with PVD, PECVD is the state of art approach to deposit a $SiO_2$ passivation layer because of highly conformal deposition results and less plasma damage to the deposited films. PECVD silicon oxide is normally performed with TEOS+$O_2$ or $SiH_4$+$N_2O$ as the source gases, where the former provides better film quality than the latter. TEOS-based silicon oxide PECVD processes are difficult to scale up, particularly to process substrates that have a surface area of 43,000 cm² and above. However, the $SiH_4$-based silicon oxide PECVD process can be scaled up to process substrates that have a surface area of 43,000 cm² and above. The $N_2O$ or $O_2$ plasma treatment on the active layer prior to the deposition of the first passivation layer 802 has shown to enable the TEOS-based silicon oxide PECVD process to scale up to substrates that have a surface area than 43,000 cm² and above. Once the first and second passivation layers 802, 902 have been deposited, the TFT 900 is complete.

In general, the $N_2O$ or $O_2$ plasma treatment may occur at a chamber pressure of between about 0.8 Torr and about 2.5 Torr. The RF power applied to the electrode to ignite and maintain the plasma may be between about 0.083 watts/cm$^2$ to about 1.0 watt/cm$^2$. The substrate may be maintained at a temperature of between about 150 degrees Celsius and about 270 degrees Celsius during the plasma treatment. The substrate may be spaced from the electrode by a distance of between about 500 mils to about 1100 mils. For $N_2O$ plasma treatment specifically, the pressure may be between about 0.8 Torr and about 1.2 Torr while the spacing is maintained between about 500 mils and about 800 mils to maintain a uniform distribution of the plasma.

TABLE

| Step | 1 | 2 | 3 | 4 | 5 | 6 | 7 |
|---|---|---|---|---|---|---|---|
| Time (sec) | 120 | 30 | 30 | 15 | 158 | 15 | 97 |
| Process power set point | 0 | 0 | 600 | 0 | 715 | 0 | 600 |
| Process spacing (mil) | 500 | 500 | 500 | 500 | 500 | 800 | 800 |
| Process pressure (mtorr) | 800 | 12000 | 1200 | 800 | 800 | 1200 | 1200 |
| $N_2O$ | 5658 | 5658 | 5658 | 5658 | 5658 | 0 | 0 |
| $N_2$ | 0 | 0 | 0 | 0 | 0 | 3500 | 3500 |
| $NH_3$ | 0 | 0 | 0 | 0 | 0 | 600 | 600 |
| $SiH_4$ | 0 | 0 | 0 | 48 | 48 | 60 | 60 |

The table above shows the processing conditions according to one embodiment for not only the $N_2O$ plasma treatment, but also for forming a first and second passivation layer. Each of the steps that occur in the table above occur in-situ the same processing chamber, such as a PECVD processing chamber available from AKT, a subsidiary of Applied Materials, Inc., Santa Clara, Calif. It is to be understood that the process may be performed in other chambers, including those sold by other manufacturers. The processing conditions identified in the table above occurred in a processing chamber sized to process a substrate having a surface area of about 2,000 cm$^2$.

In step 1, $N_2O$ is introduced to the processing chamber at a flow rate of about 5658 sccm while the substrate is spaced about 500 mils from the gas distribution showerhead. The processing chamber pressure is maintained at about 800 mTorr for about 120 seconds. No other gases are introduced to the processing chamber during step 1. Then, in step 2, while maintaining the substrate to gas distribution showerhead spacing at about 500 mils, the chamber pressure is increased to about 1200 mTorr for over a time period of about 30 seconds. During step 2, no additional gases are introduced into the processing chamber, and the $N_2O$ gas in the processing chamber ignited into a plasma. The $N_2O$ gas in step 2 continues to be introduced at a flow rate of about 5658 sccm. In step 3, the processing chamber has reached the pressure of about 1200 mTorr. The substrate to gas distribution showerhead spacing remains about 500 mils and the $N_2O$ gas flow rate remains at about 5658 sccm. For a time period of about 30 seconds, an RF bias is applied to the gas distribution showerhead to ignite the $N_2O$ gas into a plasma. The RF bias is about 600 W at a frequency of about 13.56 MHz. The power density for the $N_2O$ plasma treatment is between about 0.10 W/cm$^2$ and about 0.35 W/cm$^2$.

Now that the $N_2O$ plasma treatment is completed, deposition of the passivation layers can begin. In order to prepare the processing chamber for deposition of the first passivation layer, the RF bias to the showerhead is turned off and the chamber pressure is reduced to about 800 mTorr over a period of about 15 seconds in step 4. During step 4, the $N_2O$ gas continues to flow into the chamber at about 5658 sccm and $SiH_4$ gas begins to flow into the chamber at a rate of about 48 sccm. The substrate to gas distribution showerhead remains at about 500 mils during step 4. Step 5 beings by maintaining the flow of $SiH_4$ and $N_2O$ gas at about 48 sccm and about 5658 sccm respectively while the substrate is spaced from the gas distribution showerhead by about 500 mils. The chamber pressure of about 800 mTorr is maintained for about 158 seconds while about 715 W RF power is applied to the gas distribution showerhead at about 13.56 MHz. At the completion of step 5, the first passivation layer of silicon oxide has been deposited.

In step 6, the processing chamber is prepared for deposition of the second passivation layer. In step 6, the processing chamber pressure is increased to about 1200 mTorr over a period of about 15 seconds while the substrate to gas distribution showerhead spacing is increased to about 800 mils. During step 6, the RF bias to the showerhead is turned off as is the flow of $N_2O$ gas. The flow of $SiH_4$ gas, on the other hand, is increased to about 60 sccm, and $N_2$ gas and $NH_3$ gas are introduced at flow rates of about 3500 sccm and about 600 sccm respectively. After step 6, step 7 begins by applying RF bias to the showerhead at about 600 W and a frequency of about 13.56 MHz for about 97 seconds. The flow rate of $SiH_4$, $N_2$ and $NH_3$ remains at about 60 sccm, about 3500 sccm and about 600 sccm respectively. At the completion of step 7, the second passivation layer of silicon nitride has been deposited over the first passivation layer. During each of steps 1-7, the processing chamber is maintained at a temperature of between about 200 degrees Celsius and about 250 degrees Celsius. Thus, the $N_2O$ plasma treatment, the first passivation layer deposition and the second passivation layer deposition all occur in-situ the same chamber.

Figure 10A:
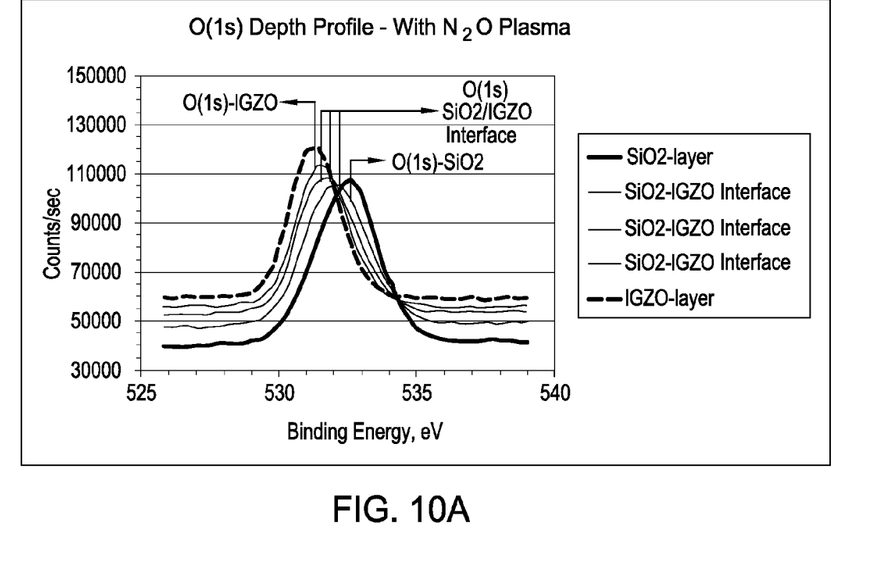
FIGS. 10A-10C show the effects of $N_2O$ plasma treatment on the TFT.
Figure 10B:
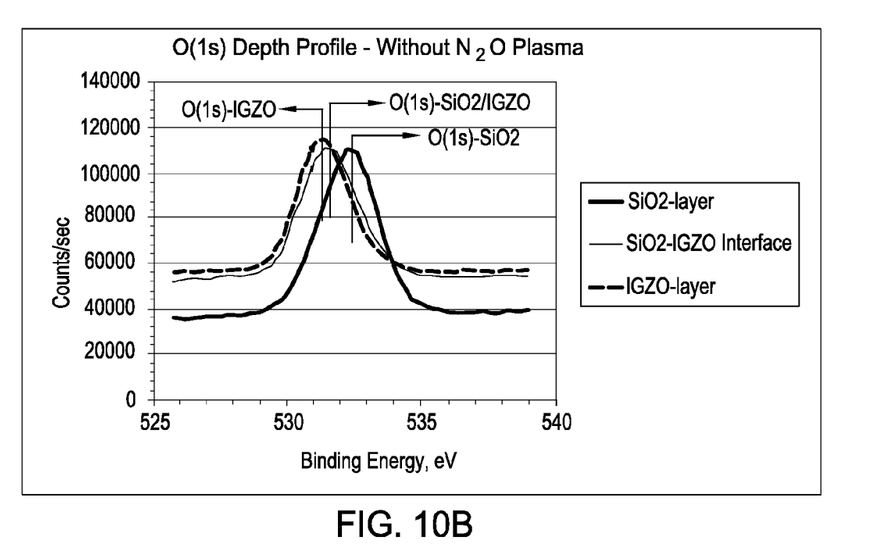
Figure 10C:
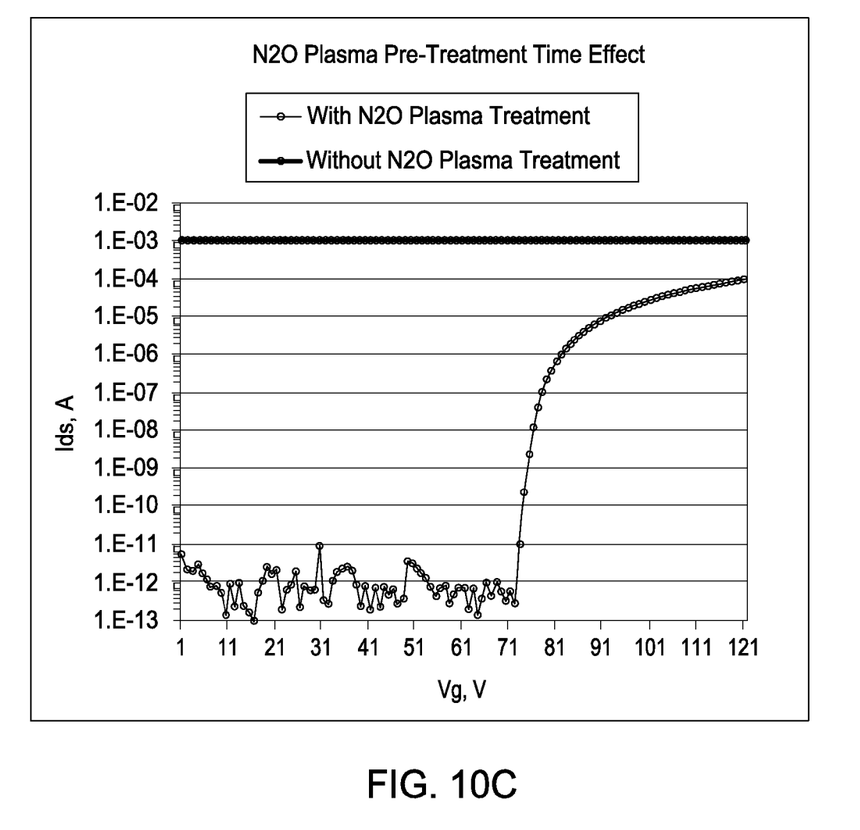

FIGS. 10A-10C show the effects of $N_2O$ plasma treatment on the TFT. FIG. 10A shows treatment shows a gradient change in the chemical states of IGZO—$SiO_2$ interface. While FIG. 10B shows a sharp change in chemical states at the IGZO—$SiO_2$ interface due to the lack of $N_2O$ plasma treatment. The spectra used to create the x-ray photoelectron spectroscopy depth profiles for FIGS. 10A-10B were taken at every 50 Angstrom in depth. As shown in FIG. 10C, no TFT characteristic IV curve can be observed without $N_2O$ plasma treatment.

Figure 11:
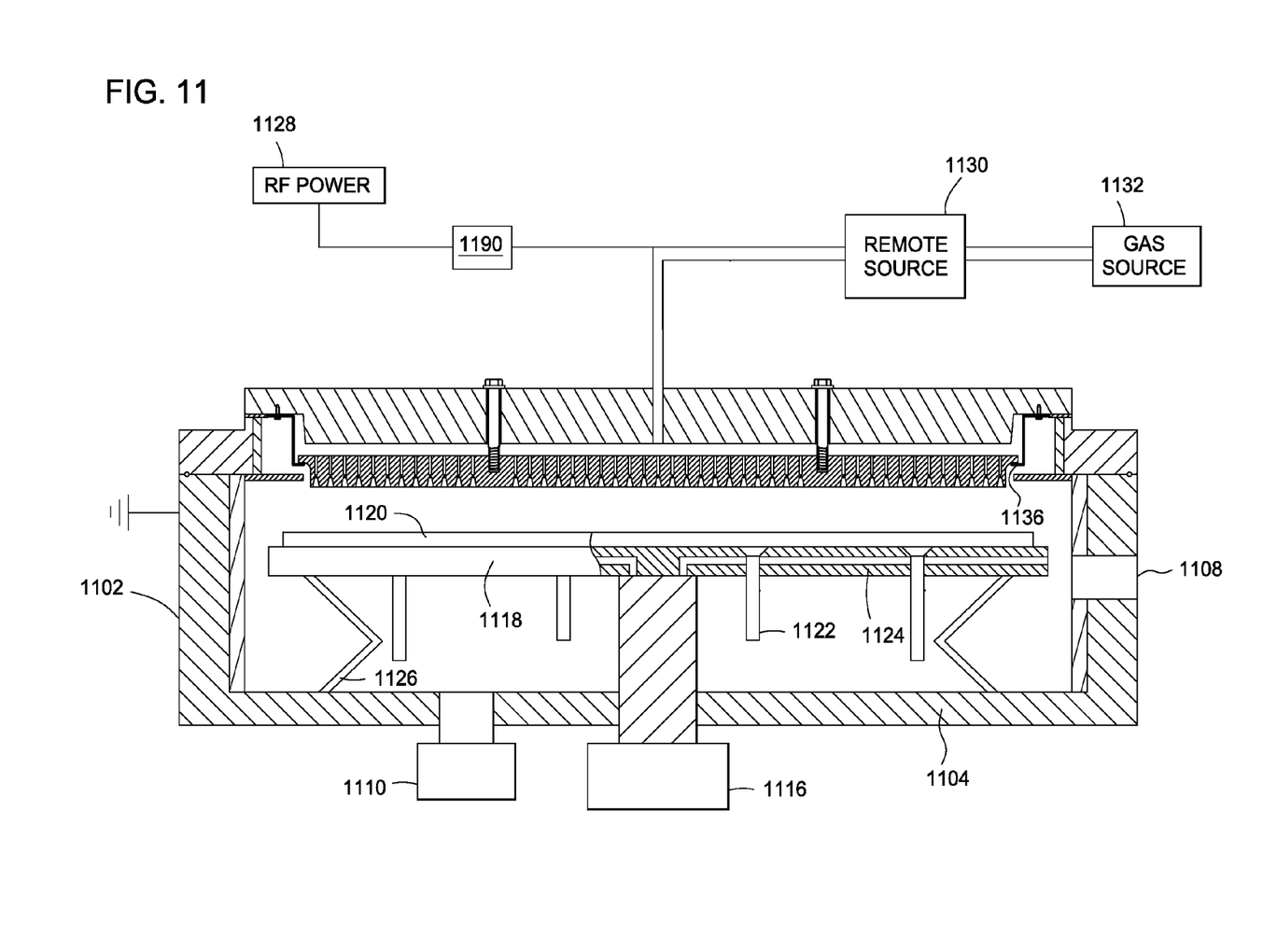
FIG. 11 is a cross sectional view of a PECVD apparatus according to one embodiment of the invention.

FIG. 11 is a cross sectional view of a PECVD apparatus that may be utilized to produce the thin film transistors described here. The apparatus includes a chamber 1100 in which one or more films may be deposited onto a substrate 1120. The chamber 1100 generally includes walls 1102, a bottom 1104 and a showerhead 1106 which define a process volume. A substrate support 1118 is disposed within the process volume. The process volume is accessed through a slit valve opening 1108 such that the substrate 1120 may be transferred in and out of the chamber 1100. The substrate support 1118 may be coupled to an actuator 1116 to raise and lower the substrate support 1118. Lift pins 1122 are moveably disposed through the substrate support 1118 to move a substrate to and from the substrate receiving surface. The substrate support 1118 may also include heating and/or cooling elements 1124 to maintain the substrate support 1118 at a desired temperature. The substrate support 1118 may also include RF return straps 1126 to provide an RF return path at the periphery of the substrate support 1118.

The showerhead 1106 is coupled to a backing plate 1112 by a fastening mechanism 1150. The showerhead 1106 may be coupled to the backing plate 1112 by one or more fastening mechanisms 1150 to help prevent sag and/or control the straightness/curvature of the showerhead 1106.

A gas source 1132 is coupled to the backing plate 1112 to provide gas through gas passages in the showerhead 1106 to a processing area between the showerhead 1106 and the substrate 1120. A vacuum pump 1110 is coupled to the chamber 1100 to control the process volume at a desired pressure. An RF source 1128 is coupled through a match network 1190 to the backing plate 1112 and/or to the showerhead 1106 to provide an RF current to the showerhead 1106. The RF current creates an electric field between the showerhead 1106 and the substrate support 1118 so that a plasma may be generated from the gases between the showerhead 1106 and the substrate support 1118.

A remote plasma source 1130, such as an inductively coupled remote plasma source 1130, may also be coupled between the gas source 1132 and the backing plate 1112. Between processing substrates, a cleaning gas may be provided to the remote plasma source 1130 so that a remote plasma is generated. The radicals from the remote plasma may be provided to chamber 1100 to clean chamber 1100 components. The cleaning gas may be further excited by the RF source 1128 provided to the showerhead 1106.

The showerhead 1106 may additionally be coupled to the backing plate 1112 by showerhead suspension 1134. In one embodiment, the showerhead suspension 1134 is a flexible metal skirt. The showerhead suspension 1134 may have a lip 1136 upon which the showerhead 1106 may rest. The backing plate 1112 may rest on an upper surface of a ledge 1114 coupled with the chamber walls 1102 to seal the chamber 1100.

By treating the active channel of an IGZO or zinc oxide TFT with an $N_2O$ or $O_2$ plasma after defining the source and drain electrodes but before formation of passivation or etch stop layers, a consistent TFT may be produced with minimal risk of plasma damage.

While the foregoing is directed to embodiments of the present invention, other and further embodiments of the invention may be devised without departing from the basic scope thereof, and the scope thereof is determined by the claims that follow.

The invention claimed is:

1. A method of forming a thin film transistor, comprising:
   depositing an active layer over a substrate in a thin film transistor;
   depositing a conductive layer over the active layer;
   patterning the conductive layer to form a source electrode and a drain electrode, wherein a portion of the active layer is exposed; and
   repairing the portion of the active layer with a $N_2O$ or $O_2$ plasma treatment, wherein the active layer comprises a material selected from the group consisting of zinc oxide, indium-gallium-zinc oxide, and combinations thereof, and wherein the repairing the portion of the active layer with a $N_2O$ or $O_2$ plasma treatment occurs at a temperature of between 150 degrees Celsius and 270 degrees Celsius.

2. The method of claim 1, wherein the $N_2O$ or $O_2$ plasma treatment occurs at a power density of between 0.083 $W/cm^2$ and 1.0 $W/cm^2$.

3. The method of claim 2, wherein the $N_2O$ or $O_2$ plasma treatment occurs at a pressure of between 0.8 Torr and 2.5 Torr.

4. The method of claim 3, wherein the $N_2O$ or $O_2$ plasma treatment occurs while a substrate upon which the thin film transistor is formed is spaced between 500 mils and 1100 mils from an electrode.

5. A method of forming a thin film transistor, comprising:
   depositing an active layer over a substrate in a thin film transistor;
   depositing a conductive layer over the active layer;
   patterning the conductive layer to form a source electrode and a drain electrode, wherein a portion of the active layer is exposed; and
   repairing the portion of the active layer with a $N_2O$ or $O_2$ plasma treatment, wherein the active layer comprises a material selected from the group consisting of zinc oxide, indium-gallium-zinc oxide, and combinations thereof, and wherein repairing the portion of the active layer with a $N_2O$ or $O_2$ plasma treatment comprises repairing the portion of the active channel with $N_2O$ plasma.

6. The method of claim 5, wherein the repairing the portion of the active layer with a $N_2O$ plasma treatment occurs at a temperature of between 150 degrees Celsius and 270 degrees Celsius.

7. The method of claim 6, wherein the $N_2O$ plasma treatment occurs at a power density of between 0.083 $W/cm^2$ and 1.0 $W/cm^2$.

8. The method of claim 7, wherein the $N_2O$ plasma treatment occurs at a pressure of between 0.8 Torr and 1.2 Torr.

9. The method of claim 8, wherein the $N_2O$ plasma treatment occurs while a substrate upon which the thin film transistor is formed is spaced between 500 mils and 800 mils from an electrode.

10. A method of forming a thin film transistor, comprising:
    forming a gate electrode over a substrate;
    depositing a gate dielectric layer over the gate electrode and the substrate;
    depositing an indium-gallium-zinc oxide active layer over the gate dielectric layer;
    depositing a conductive layer over the active layer;
    removing at least a portion of the conductive layer to form source and drain electrodes and to form an active channel by exposing a portion of the active layer;
    repairing the portion of the active layer with a $N_2O$ or $O_2$ plasma treatment, the $N_2$ or $O_2$ plasma treatment forming a $N_2O$ or $O_2$ plasma treated active channel; and
    depositing one or more passivation or etch stop layers over the $N_2O$ or $O_2$ plasma treated active channel.

11. The method of claim 10, wherein the repairing the portion of the active layer with a $N_2O$ or $O_2$ plasma treatment occurs at a temperature of between 150 degrees Celsius and 270 degrees Celsius.

12. The method of claim 11, wherein the $N_2O$ or $O_2$ plasma treatment occurs at a power density of between 0.083 $W/cm^2$ and 1.0 $W/cm^2$.

13. The method of claim 12, wherein the $N_2O$ or $O_2$ plasma treatment occurs at a pressure of between 0.8 Torr and 2.5 Torr.

14. The method of claim 13, wherein the $N_2O$ or $O_2$ plasma treatment occurs while the substrate is spaced between 500 mils and 1100 mils from an electrode.

15. A method of forming a thin film transistor, comprising:
    forming a gate electrode over a substrate;
    depositing a gate dielectric layer over the gate electrode and the substrate;

depositing a zinc oxide active layer over the gate dielectric layer;

depositing a conductive layer over the active layer;

removing at least a portion of the conductive layer to form source and drain electrodes and to form an active channel by exposing a portion of the active layer;

repairing the portion of the active layer with a $N_2O$ or $O_2$ plasma treatment, the $N_2$ or $O_2$ plasma treatment forming a $N_2O$ or $O_2$ plasma treated active channel; and depositing one or more passivation or etch stop layers over the $N_2O$ or $O_2$ plasma treated active channel.

16. The method of claim 15, wherein the repairing the portion of the active layer with a $N_2O$ or $O_2$ plasma treatment occurs at a temperature of between 150 degrees Celsius and 270 degrees Celsius, wherein the $N_2O$ or $O_2$ plasma treatment occurs at a power density of between 0.083 $W/cm^2$ and 1.0 $W/cm^2$, wherein the $N_2O$ or $O_2$ plasma treatment occurs at a pressure of between 0.8 Torr and 2.5 Torr, and wherein the substrate is spaced between 500 mils and 1100 mils from an electrode.

* * * * *

UNITED STATES PATENT AND TRADEMARK OFFICE
CERTIFICATE OF CORRECTION

PATENT NO. : 9,553,195 B2  
APPLICATION NO. : 13/490813  
DATED : January 24, 2017  
INVENTOR(S) : Jrjyan Jerry Chen et al.

Page 1 of 1

It is certified that error appears in the above-identified patent and that said Letters Patent is hereby corrected as shown below:

In the Claims

In Column 8, Line 46, in Claim 10, delete "$N_2$" and insert -- $N_2O$ --, therefor.

In Column 9, Line 8, in Claim 15, delete "$N_2$" and insert -- $N_2O$ --, therefor.

Signed and Sealed this  
Eighteenth Day of April, 2017

Michelle K. Lee  
*Director of the United States Patent and Trademark Office*